(12) United States Patent
Chu

(10) Patent No.: US 10,312,032 B1  
(45) Date of Patent: Jun. 4, 2019

(54) PUSH SWITCH WITH DUAL SENSING MODE

(71) Applicant: Ching-Hsiung Chu, New Taipei (TW)

(72) Inventor: Ching-Hsiung Chu, New Taipei (TW)

(73) Assignee: Ching-Hsiung Chu, New Taipei (TW)

( * ) Notice: Subject to any disclaimer, the term of this patent is extended or adjusted under 35 U.S.C. 154(b) by 0 days.

(21) Appl. No.: 15/965,865

(22) Filed: Apr. 28, 2018

(30) Foreign Application Priority Data

Apr. 9, 2018 (TW) .............................. 107112105 A

(51) Int. Cl.
- *H01H 13/14* (2006.01)
- *H01H 13/04* (2006.01)
- *H01H 13/52* (2006.01)
- *H01H 13/02* (2006.01)

(52) U.S. Cl.
CPC .......... *H01H 13/14* (2013.01); *H01H 13/023* (2013.01); *H01H 13/04* (2013.01); *H01H 13/52* (2013.01); *H01H 2233/078* (2013.01); *H01H 2239/024* (2013.01)

(58) Field of Classification Search
CPC ......... H01H 13/14; H01H 13/04; H01H 13/52
USPC ..................................................... 200/293, 600
See application file for complete search history.

(56) References Cited

U.S. PATENT DOCUMENTS

| | | | | |
|---|---|---|---|---|
| 2011/0042196 A1* | 2/2011 | Yokoyama | ........... | H01H 13/705 200/5 A |
| 2016/0064163 A1* | 3/2016 | Chu | ..................... | H01H 13/023 200/314 |
| 2016/0197608 A1* | 7/2016 | Morey | ................. | H03K 17/962 200/600 |

* cited by examiner

*Primary Examiner* — Edwin A. Leon  
*Assistant Examiner* — Iman Malakooti

(57) ABSTRACT

A push switch with dual sensing mode including a main socket, a sliding base, a keycap, a sensing circuit board and a touch sensor is provided. The main socket has an opening and a base. The sliding base is slidably fixed in the main socket. The keycap is correspondingly fixed at the upper end of the sliding base. The sensing circuit board is correspondingly installed in the main socket. The touch sensor is disposed in a keycap chamber of the keycap. When a user places his finger on the upper end of the keycap, the touch sensor generates an inductance and causes the sensing circuit board to output a touch signal.

6 Claims, 7 Drawing Sheets

PUSH SWITCH WITH DUAL SENSING MODE

This application claims the benefit of the priority based on Taiwan Patent Application No. 107112105 filed on Apr. 9, 2018, the disclosures of which are incorporated herein by reference in their entirety.

CROSS-REFERENCES TO RELATED APPLICATIONS

Not applicable.

BACKGROUND OF THE INVENTION

Field of the Invention

The present invention relates to a push switch with dual sensing mode; and more particularly, to a push switch that generates two independent signals through two different forms of physical pressing and touch sensing.

Descriptions of the Related Art

In various electronic products, it is often seen that the activation and control of functions are performed by pressing a button to generate a signal. Besides, the specification of the switch, and the sizes and types of the dimension of the switch are numerous, and the application range is also quite extensive. In order to allow the user to confirm whether the pressing is applied, there is also a lamp-type switch that includes a light emitting element therein and generates light for confirmation after pressing.

Switches that are commonly used in precision devices, small devices or small electronic devices are generally turned on or off by physical pressing. With the development of touch technologies, there also has sensing switch that sense static electricity through the human body. Although each of the physical pressing and the sensing switch has its own advantages, a single switch can usually only output one kind of signal, and thus also make it use restricted.

In addition, in a conventional physical pressing switch, since it is impossible to determine whether a presser is a user's finger, it is not sufficient to prevent inadvertent touch, which is a disadvantage. In the discussion of the touch type switch with a lamp, since its interior uses a metal sensing sheet as a mechanism for inductive conduction, the metal sensing sheet will shield the light emitting elements therein and resulting the effect without whole light transmission, which is also a disadvantage.

As mentioned above, the inventor of the present invention conceived and designed a push switch having a dual sensing mode, aiming at improving the lack of the existing technology and further improving the industrial application.

SUMMARY OF THE INVENTION

In view of the above-mentioned deficiencies of the prior art, the present invention is to design a push switch with dual induction mode with patentability, novelty and industrial utilization, for overcome the difficulties of the prior art.

To achieve the aforesaid objective, the technical means adopted of the present invention is to design a push switch with dual sensing mode including a main socket, a sliding base, a keycap, a sensing circuit board and a touch sensor. The main socket is a hollow shell having an opening at the upper end, and the main socket has a base fixed at the bottom end of the main socket. A receiving slot is disposed at the inside bottom wall of the base, and a push signal conductor is disposed at the bottom wall of the receiving slot. The receiving slot further has a recovering elastic part therein, and the recovering elastic part has a pressing surface. The pressing surface facing the push signal conductor without contacting the push signal conductor. When the recovering elastic part is pressed form the upper end and making the pressing surface to contact the push signal conductor, the push signal conductor is turned on to transmit a pressing signal. The sliding base is slidably fixed in the main socket and the center of the sliding base 20 is hollow. The bottom portion of the sliding base has a pusher, and the pusher is against the upper end of the recovering elastic part. The keycap is correspondingly fixed at the upper end of the sliding base. When the keycap is pressed downward, the sliding base is linked to press the recovering elastic part. The bottom end of the keycap has an opening and is concave inward to form a keycap chamber. The sensing circuit board is correspondingly installed in the main socket. The touch sensor is disposed at the inner sidewall of the top wall of the keycap chamber, and the touch sensor has an extending end. The extending end is electrically connected to the sensing circuit board, and thus when a user places his finger on the upper end of the keycap, the touch sensor generates an inductance and causes the sensing circuit board to output a touch signal.

The push switch with dual sensing mode of the present invention mainly designed corresponds to a switch button which provides two signal outputs for pressing signal and touch signal, so as to achieve the functions of the physical touch and the sensing touch, and increase the flexibility of operation in a limited space, which is not available to the prior art.

DESCRIPTION OF THE PREFERRED EMBODIMENT

Figure 1:
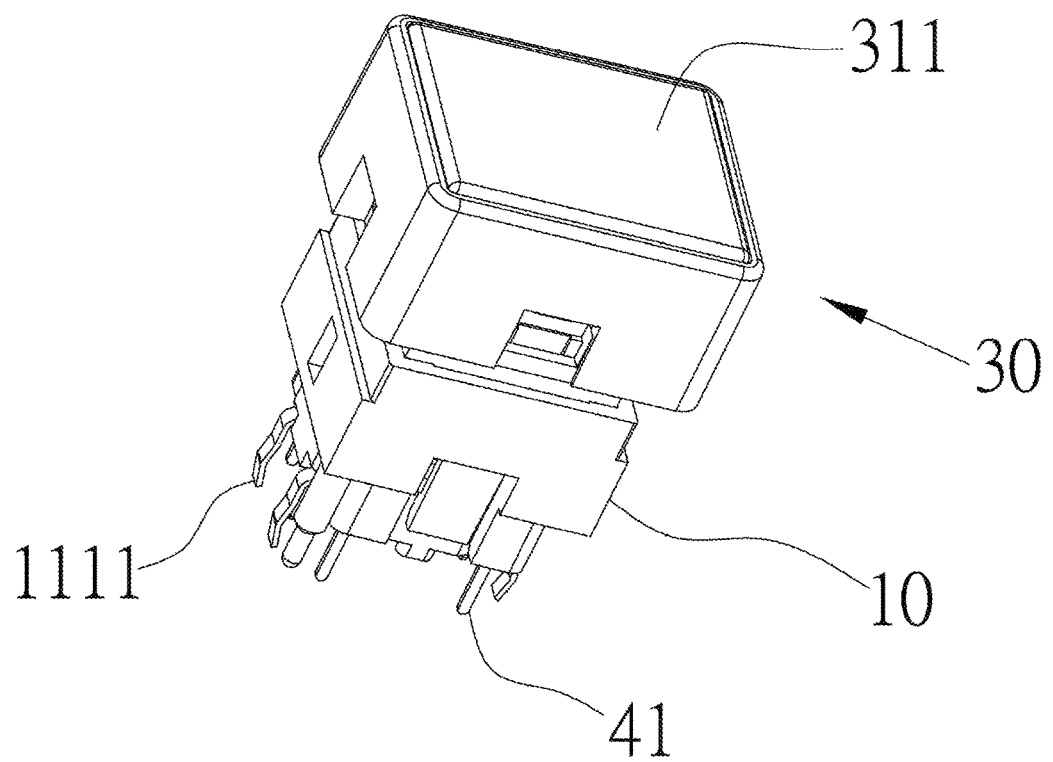
FIG. 1 is a schematic view of a push switch with dual sensing mode according to the present invention.
Figure 2:
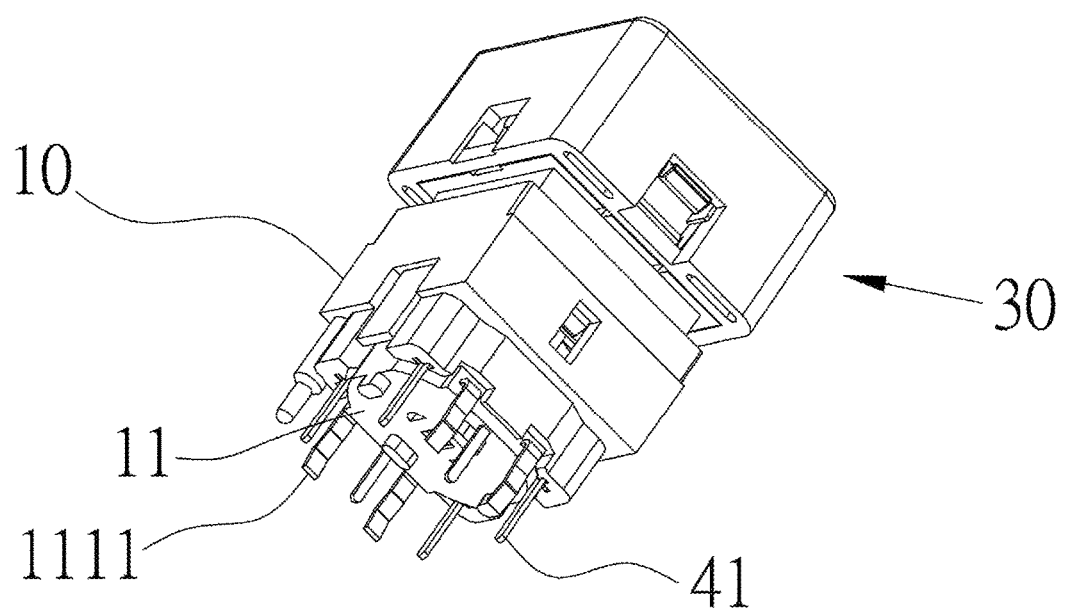
FIG. 2 is another schematic view of the push switch with dual sensing mode according to the present invention.
Figure 3:
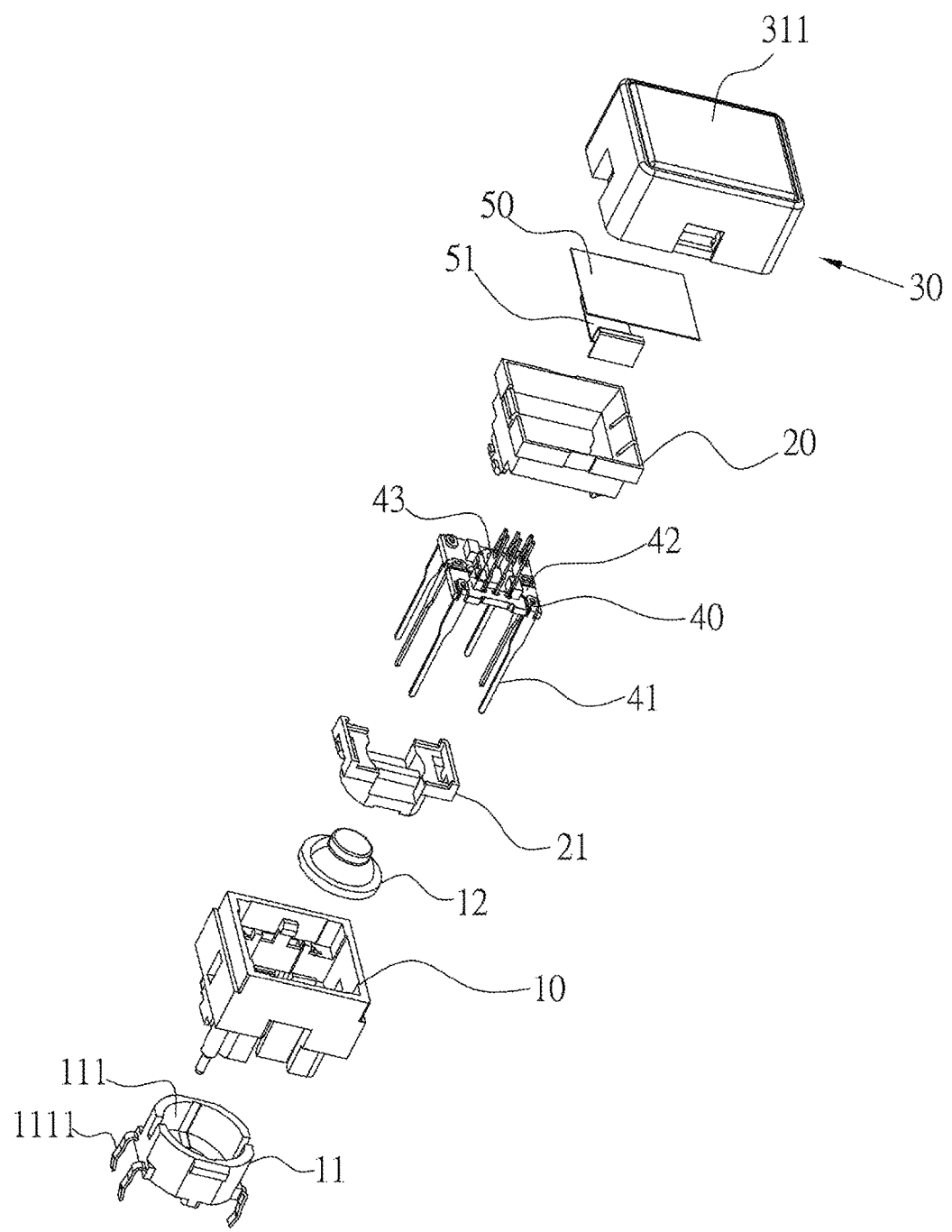
FIG. 3 is an exploded view of the push switch with dual sensing mode according to the present invention.
Figure 4:
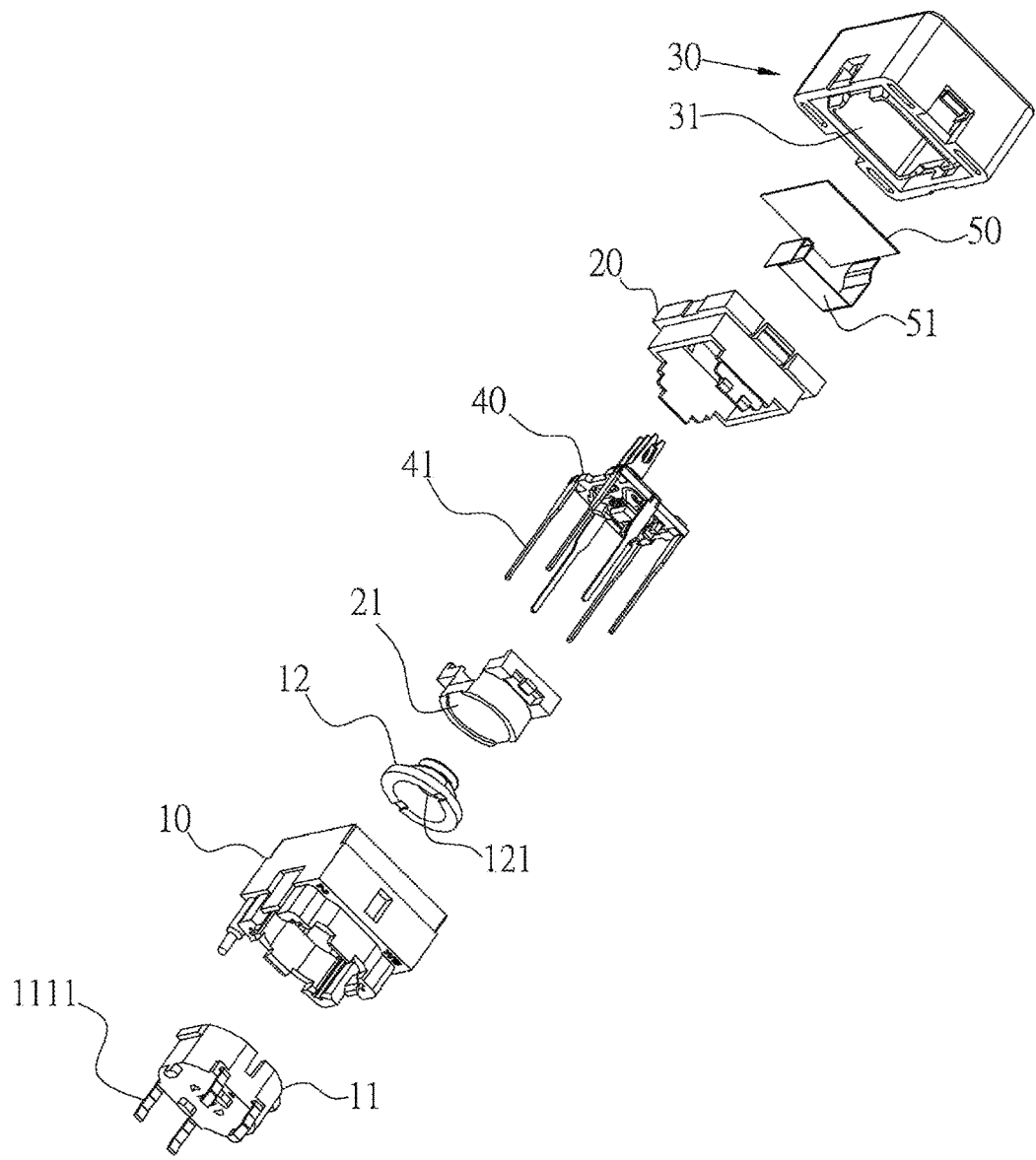
FIG. 4 is another exploded view of the push switch with dual sensing mode according to the present invention.
Figure 5:
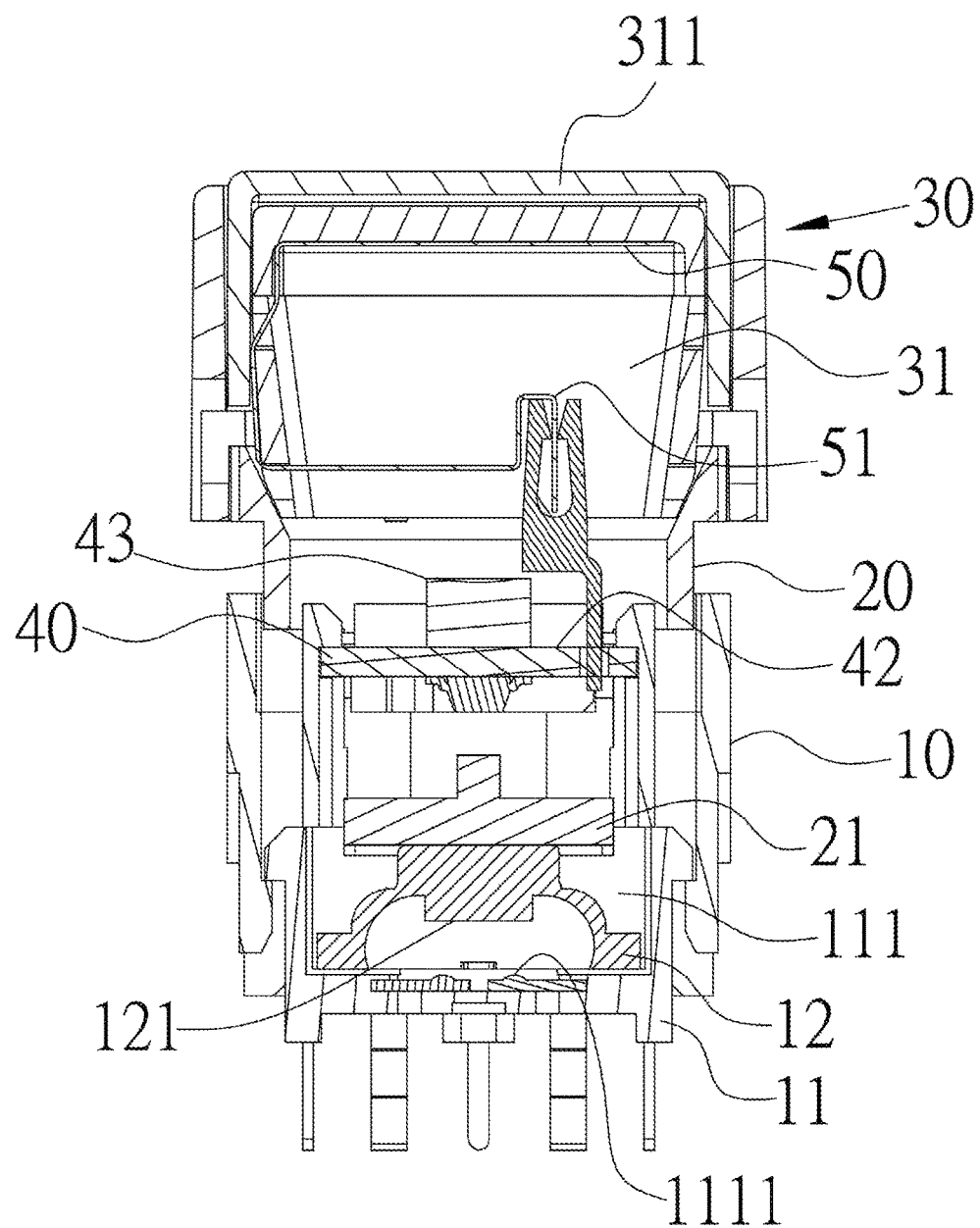
FIG. 5 is a cross-sectional view of the push switch with dual sensing mode according to the present invention.
Figure 6:
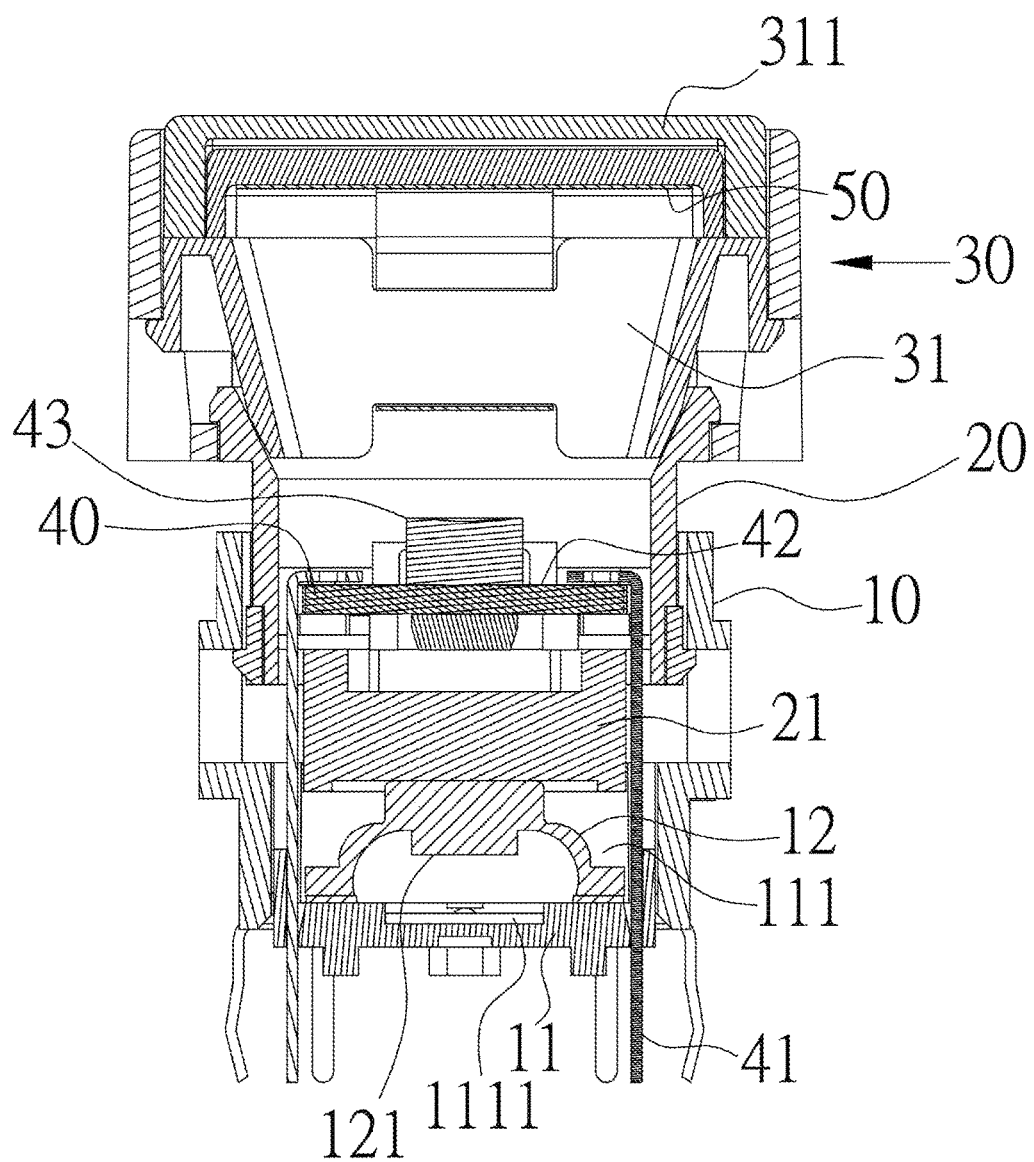
FIG. 6 is another cross-sectional view of the push switch with dual sensing mode according to the present invention.
Figure 7:
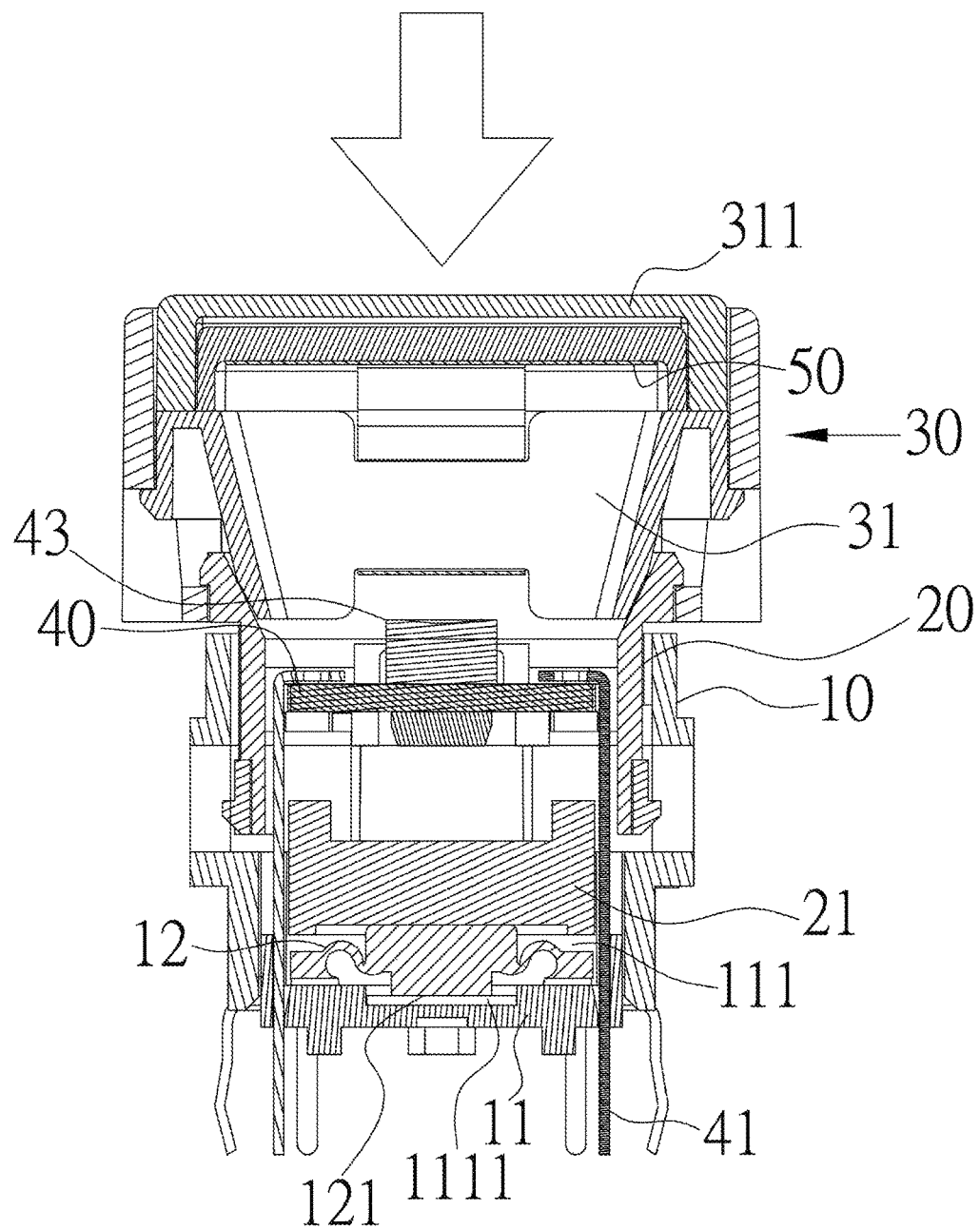
FIG. 7 is a cross-sectional view of pressing of the push switch with dual sensing mode according to the present invention.

Please refer to FIGS. 1 to 7. As shown in FIG. 1 to FIG. 7, the present invention relates to a push switch with dual sensing mode, including: a main socket 10, a sliding base 20, a keycap 30, a sensing circuit board 40 and a touch sensor 50.

The mentioned main socket 10 is a hollow shell having an opening at an upper end. The main socket 10 has a base 11 fixed at the bottom end of the main socket 10. A receiving slot 111 is disposed at the inside bottom wall of the base 11, and a push signal conductor 1111 is disposed at the bottom wall of the receiving slot 111. The receiving slot 111 further has a recovering elastic part 12 therein, and the recovering elastic part 12 has a pressing surface 121. The pressing surface 121 faces the push signal conductor 1111 without contacting the push signal conductor 1111. When the recovering elastic part 12 is pressed form the upper end and making the pressing surface 121 to contact the push signal conductor 1111, the push signal conductor 1111 is turned on to transmit a pressing signal.

The mentioned sliding base 20 corresponds to the opening disposed at the upper end of the main socket 10, the sliding base 20 goes into the main socket 10 via the opening, and the sliding base 20 is slidably fixed in the main socket 10. The center of the sliding base 20 is hollow. The bottom portion of the sliding base 20 has a pusher 21, and the pusher 21 is disposed against the upper end of the recovering elastic part 12.

The mentioned keycap 30 is correspondingly fixed at the upper end of the sliding base 20. When the keycap 30 is pressed downward, the keycap 30 is linked to the sliding base 20 to press the recovering elastic part 12 for the push signal conductor 1111 transmitting the pressing signal. The bottom end of the keycap 30 has an opening, the keycap 30 is concave inward to form a keycap chamber 31, and the top wall 311 of the keycap chamber 31 is transparent.

The sensing circuit board 40 is correspondingly installed in the main socket 10 and is located in a hollow section of the sliding seat 20. The bottom portion of the sensing circuit board 40 has a plurality of signal transmission sections 41, and the signal transmission sections 41 go through the bottom wall of the receiving slot 111. In addition, the sensing circuit board 40 has an upper end surface 42, the upper end surface 42 is provided with a light source module 43, and the light emitting direction of the light source module 43 is toward the top wall 311 of the keycap chamber 31.

The mentioned touch sensor 50 may be a transparent touch conductive soft film (for example: ITO), the touch sensor 50 is fixed on the inner sidewall of the top wall 311 of the keycap chamber 31. The touch sensor 50 has an extending end 51, the extending end 51 is electrically connected to the sensing circuit board 40. Thus, when a user places his finger on the upper end of the keycap 30, the touch sensor 50 may generates a signal due to static electricity of the finger, and then causes the sensing circuit board 40 to output a touch signal via the signal transmission sections 41.

The light source module 43 may be electrically connected to the signal transmission section 41 and the light source module 43 emits light when the touch signal is outputted. Or in another embodiment, the light source module 43 may be electrically connected to the signal transmission section 41 and the push signal conductor 1111, and the light source module 43 emits light when the touch signal and the pressing signal are both outputted.

The push switch with dual sensing mode of the present invention mainly corresponds to a switch button which provides two signal outputs for pressing signal and touch signal, so as to achieve the functions of the physical touch and the sensing touch, and increase the flexibility of operation in a limited space. For example, the touch signal can be used as auxiliary to confirm that the pressing signal is pressed by a user's finger, thereby avoiding the object being inadvertently pressed by the other non-user's finger. The condition that causes the device to start up or shut down cannot be achieved by the prior art.

What is claimed is:

1. A push switch with dual sensing mode, including:
   a main socket, having an opening at the upper end, the main socket having a base fixed at the bottom end of the main socket, a push signal conductor is disposed at the inside bottom wall of the base, the base further having a recovering elastic part, the recovering elastic part having a pressing surface, and the pressing surface facing the push signal conductor without contacting the push signal conductor, when the recovering elastic part is pressed form the upper end and making the pressing surface to contact the push signal conductor, the push signal conductor is turned on to transmit a pressing signal;
   a sliding base; slidably fixed in the main socket, the bottom portion of the sliding base having a pusher, the pusher is against the upper end of the recovering elastic part;
   a keycap, correspondingly fixed at the upper end of the sliding base, when the keycap is pressed downward, the sliding base is linked to press the recovering elastic part, the bottom end of the keycap has an opening and is concave inward to form a keycap chamber;
   a sensing circuit board, correspondingly installed in the main socket; and
   a touch sensor, disposed in the keycap chamber, the touch sensor having an extending end, the extending end is electrically connected to the sensing circuit board, and thus when a user places his finger on the upper end of the keycap, the touch sensor generates an inductance and causes the sensing circuit board to output a touch signal,
   wherein the push switch is activated to be pressed after outputting the touch signal.

2. The push switch with dual sensing mode as claimed in claim 1, wherein the touch sensor is a transparent touch conductive soft film fixed on the inner sidewall of a top wall of the keycap chamber.

3. The push switch with dual sensing mode as claimed in claim 2, wherein the top wall of the keycap chamber is transparent, in addition, the sensing circuit board has an upper end surface, the upper end surface is provided with a light source module, and the light emitting direction of the light source module is toward the top wall of the keycap chamber.

4. The push switch with dual sensing mode as claimed in claim 3, wherein the sensing circuit board has a plurality of signal transmission sections.

5. The push switch with dual sensing mode as claimed in claim 4, wherein the light source module is electrically connected to the signal transmission section and emits light when the touch signal is outputted.

6. The push switch with dual sensing mode as claimed in claim 4, wherein the light source module is electrically connected to the signal transmission section and the push signal conductor, and the light source module emits light when both the touch signal and the pressing signal are outputted.

* * * * *